United States Patent [19]
Yoneda et al.

[11] Patent Number: 5,625,222
[45] Date of Patent: Apr. 29, 1997

[54] SEMICONDUCTOR DEVICE IN A RESIN PACKAGE HOUSED IN A FRAME HAVING HIGH THERMAL CONDUCTIVITY

[75] Inventors: Yoshiyuki Yoneda; Kazuto Tsuji, both of Kawasaki, Japan

[73] Assignee: Fujitsu Limited, Kawasaki, Japan

[21] Appl. No.: 281,098

[22] Filed: Jul. 27, 1994

[30] Foreign Application Priority Data

Nov. 18, 1993 [JP] Japan .................. 5-289538

[51] Int. Cl.[6] .............. H01L 23/08; H01L 23/10; H01L 23/28; H01L 23/34
[52] U.S. Cl. .................. 257/687; 257/700; 257/706; 257/713; 257/787
[58] Field of Search .................. 257/700, 706, 257/712, 778, 703, 713, 796, 787, 687, 678, 690

[56] References Cited

U.S. PATENT DOCUMENTS

| | | | |
|---|---|---|---|
| 4,887,148 | 12/1989 | Mu | 257/687 |
| 5,108,955 | 4/1992 | Ishida et al. | 437/214 |
| 5,136,366 | 8/1992 | Worp et al. | 361/400 |
| 5,227,663 | 7/1993 | Patil et al. | 257/796 |
| 5,285,352 | 2/1994 | Pastore et al. | 257/712 |
| 5,291,062 | 3/1994 | Higgins, III | 257/698 |

FOREIGN PATENT DOCUMENTS 0260463  10/1990  Japan ..................... 257/687

*Primary Examiner*—Peter Toby Brown
*Attorney, Agent, or Firm*—Armstrong, Westerman, Hattori, McLeland & Naughton

[57] ABSTRACT

A semiconductor device including a substrate, solder bumps provided on a lower major surface of the substrate, a semiconductor chip provided on an upper major surface of the substrate, a resin package body provided on the upper major surface of the substrate so as to bury the semiconductor chip therein, a thermally conductive frame member having a flange part supporting the substrate at a rim part of the substrate, wherein the thermal conductive frame member has a thermal conductivity substantially larger than that of the resin package body and extending along to and in an intimate contact with side walls of the resin package body.

8 Claims, 18 Drawing Sheets

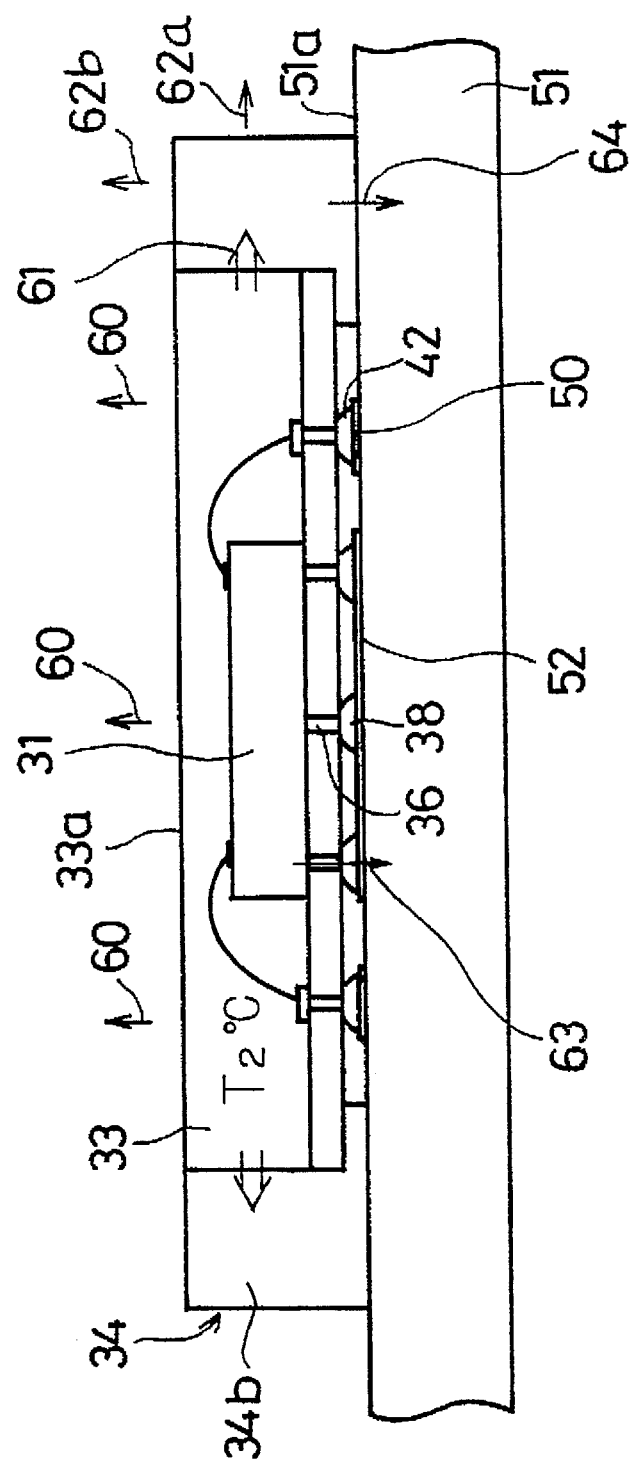

SEMICONDUCTOR DEVICE IN A RESIN PACKAGE HOUSED IN A FRAME HAVING HIGH THERMAL CONDUCTIVITY

BACKGROUND OF THE INVENTION

The present invention generally relates to semiconductor devices having a package and more particularly to a semiconductor device having solder bumps on a lower major surface of a package body.

Semiconductor devices are generally required to have a small package size. Further, such semiconductor devices should have a package easy for mounting on an apparatus in which the semiconductor device is used. Conventional packages typically have interconnection leads extending laterally from both side walls of the package body. Such conventional packages have a problem in that the pitch of the interconnection leads becomes excessively small, on the order of 0.3 mm or less, with an increasing number of the interconnection leads, without a corresponding increase in the package size. With such a small pitch of the interconnection leads, the mounting of the semiconductor device on a printed circuit board of an apparatus is extremely difficult. In order to increase the pitch of the interconnection leads for easy mounting, on the other hand, one has to increase the package size and hence the area that the semiconductor device occupies.

In order to circumvent this problem, a so-called ball grid array package is proposed, wherein a number of solder bumps each forming a terminal, are arranged in rows and columns on the lower major surface of the package body. In such a construction, one can use substantial area of the package body for the interconnection, and the problem of reduced pitch between the interconnection leads is successfully avoided.

Meanwhile, recent semiconductor devices having an increased integration density generally show an increased heating due to the increased number of semiconductor devices in the integrated circuit. Thus, the semiconductor devices nowadays are required to show an excellent heat dissipation characteristic.

FIG. 1 shows a typical conventional semiconductor device 10 disclosed in the U.S. Pat. No. 5,136,366.

Referring to FIG. 1, the semiconductor device 10 includes a package substrate 12 having a number of solder bumps 11 on a lower major surface thereof, and a semiconductor chip 13 is mounted upon an upper major surface of the package substrate 12. The semiconductor chip 13 carries thereon a number of bonding pads for external connection, while the package substrate 12 carries corresponding interconnection pads on the upper major surface of the package substrate 12. Further, the bonding pads on the semiconductor chip 13 and the interconnection pads on the package substrate 12 are interconnected by bonding wires. Further, a resin package body 15 encapsulates the semiconductor chip 13 by covering the upper major surface as well as side walls of the chip 13. The semiconductor device 10 thus formed is mounted firmly upon a multiple-layer printed circuit board 16 as indicated in FIG. 2 by means of brazing or soldering of the solder bumps on the lower major surface of the package substrate 12 upon corresponding terminal pads 17 of the printed circuit board 16.

In such a structure, it should be noted that the heat generated in the semiconductor chip 13 is conducted through the resin package body 15 and is radiated to the environment from the upper major surface as well as side walls of the package body 15, while it is known that the radiation of heat from a resin package body to the environment is not efficient. Thus the package body 15 of the semiconductor device tends to be heated to a high temperature upon operation of the semiconductor devices in the integrated circuit, while such a temperature elevation decreases the efficiency of heat transfer through the resin package body 15. Thus, the temperature of the device increases further with continued operation of the device.

Further, the conventional semiconductor device 10 has a problem in that moisture in the environment tends to penetrate inside the resin package body 15 along a boundary 18 between the package substrate 12 and the resin package body 15. It should be noted that the boundary 18 is exposed at a circumferential edge 19 of the package body 15. When such moisture penetrate to the boundary 18, there is a substantial risk that the bonding wires 14 are subjected to corrosion, while such a corrosion may ultimately lead to premature disconnection of the bonding wires 14 and hence the failure of the semiconductor device.

SUMMARY OF THE INVENTION

Accordingly, it is a general object of the present invention to provide a novel and useful semiconductor device wherein the foregoing problems are eliminated.

Another and more specific object of the present invention is to provide a semiconductor device having a package with improved heat dissipation and improved resistance against penetration of moisture.

Another object of the present invention is to provide a semiconductor device, comprising:

a substrate having upper and lower major surfaces;

solder bumps provided on said lower major surface of said substrate;

a semiconductor chip provided on said upper major surface of said substrate;

a resin package body provided on said upper major surface of said substrate so as to bury said semiconductor chip therein, said resin package body having an upper major surface and side walls surrounding said package body;

a thermally conductive frame member having a flange part 34c supporting, said substrate at a rim part of said substrate, said thermally conductive frame member having a thermal conductivity substantially larger than that of said resin package body and extending along to and in an intimate contact with said side walls of said resin package body. According to the present invention, said thermally conductive frame member absorbs heat from the resin package body. Further, the frame member covers the peripheral edge of the boundary surface between the substrate and the resin package body, such that penetration of moisture into the package body along the boundary is prevented.

In a preferred embodiment of the present invention, said thermally conductive frame member carries a heat radiating fin structure on an outer, exposed surface thereof. According to the present invention as set forth above, the dissipation of heat from the package body to the environment is substantially facilitated.

In another preferred embodiment of the present invention, said thermally conductive frame member carries one or more projecting ribs on an inner surface thereof that intimately contacts with said side walls of said resin package body, such that said one or more ribs project into said resin package body. According to the present invention as set forth above, the area in which the thermally conductive frame member and the resin package body contact with each other increases, and a reliable bonding is achieved between the frame member and the resin package body.

In another preferred embodiment of the present invention, said thermally conductive frame member carries one or more grooves extending along an inner periphery thereof. According to the present invention as set forth above, the grooves engage with the corresponding side walls of the resin package body, and the thermally conductive frame is held firmly upon the resin package body.

In another preferred embodiment of the present invention, said thermally conductive frame member carries a projection on an inner surface thereof facing said side walls of said resin package body in correspondence to a corner of said frame member, such that said projection engages with a mating depression on a corresponding corner of said resin package body. According to the present invention as set forth above, one can restrict the orientation of the thermally conductive member mounted upon the resin package body.

In another preferred embodiment of the present invention, said thermally conductive frame member has a flange part on an inner surface thereof such that said flange part protrudes inwardly from said frame member, said flange part including a flange surface for supporting thereon said substrate by engaging with said lower major surface of said substrate. According to the present invention as set forth above, the substrate carrying the semiconductor chip and the resin package body thereon is supported on the flange surface of the thermally conductive member.

In another preferred embodiment of the present invention, said thermally conductive frame member comprises a material selected from a group consisting of aluminum, an aluminum alloy, copper and a copper alloy, and carries an oxide film thereon. According to the present invention, one can insulate the thermally conductive frame member.

Another object of the present invention is to provide a method for fabricating a semiconductor device, comprising the steps of:

mounting a semiconductor chip carrying solder bumps on a lower major surface thereon, on a substrate surrounded by an edge, such that said substrate carries said semiconductor chip thereon;

providing a frame member such that said frame member surrounds said edge of said substrate, said frame member thereby defining a space on said substrate such that said space includes said semiconductor chip; and filling said space with a resin;

wherein said frame member has a thermal conductivity larger than a thermal conductivity of said resin. According to the present invention, one can form a resin package body such that the resin package body establishes a continuous, intimate contact with an inner surface of said frame member. Thereby, the frame member acts as a mold. Further, the efficiency of heat transfer from the resin package body to the frame member is substantially improved, and the semiconductor chip is efficiently cooled by the heat radiation from the frame member to the environment.

Another object of the present invention is to provide a method for fabricating a semiconductor device, comprising the steps of:

forming an integral substrate frame such that said integral substrate includes a main frame and a plurality of substrates connected to said main frame by respective arm portions to form an integral body, such that each of said plurality of substrates has a peripheral edge surrounding said substrate except for said arm portion;

mounting a plurality of semiconductor chips on respective substrates forming a part of said integral substrate frame;

mounting said integral substrate frame in a die that holds therein a plurality of frame members in correspondence to said plurality of substrates, such that each of said substrates is held in a corresponding frame in a state that said frame engages with said peripheral edge of said substrate, said frame thereby defining a space on said substrate;

filling a resin on said space in each of said substrates, such that said resin buries said semiconductor chip held on said substrate underneath; and cutting said arm portions for separating each of said substrates from each other. According to the present invention, it is possible to fabricate a plurality of semiconductor devices simultaneously, and the throughput of fabrication is substantially improved.

Another object of the present invention is to provide an electronic apparatus, comprising:

a substrate having upper and lower major surfaces and surrounded by a peripheral edge, said substrate carrying a plurality of conductive bumps on said lower major surface of said substrate;

a semiconductor chip provided on said upper major surface of said substrate in electric connection to said solder bumps;

a resin package body provided on said upper major surface of said substrate such that said resin package body encapsulates said semiconductor chip therein, said resin package body having a peripheral wall surrounding said resin package body; and a frame member having a thermal conductivity larger than a thermal conductivity of said resin package body, said frame member being provided on said resin package body to surround said peripheral edge in a continuous and intimate contact with said peripheral wall of said package body; and a printed circuit board having an upper major surface and carrying an interconnection conductor pattern on said upper major surface;

said substrate being provided on said upper major surface of said printed circuit board such that said plurality of conductive bumps establish an electric connection with corresponding conductor patterns on said upper major surface of said printed circuit board and such that said frame member establishes an intimate mechanical contact with said upper major surface of said printed circuit board. According to the present invention, one can efficiently dissipate heat from the semiconductor device to the printed circuit board via the frame member that establishes an intimate mechanical contact with the substrate.

In a preferred embodiment of the present invention, said frame member carries an insulating coating for electrically insulating the frame member. According to the present invention as set forth above, one can eliminate short circuit even when a metal is used for the frame member.

Other objects and further features of the present invention will become apparent from the following detailed description when read in conjunction with the attached drawings.

BRIEF DESCRIPTION OF THE DRAWINGS

FIG. 8 is a diagram showing an electronic apparatus in which the semiconductor device of the first embodiment is mounted upon a printed circuit board;

DETAILED DESCRIPTION OF THE PREFERRED EMBODIMENTS

Figure 3:
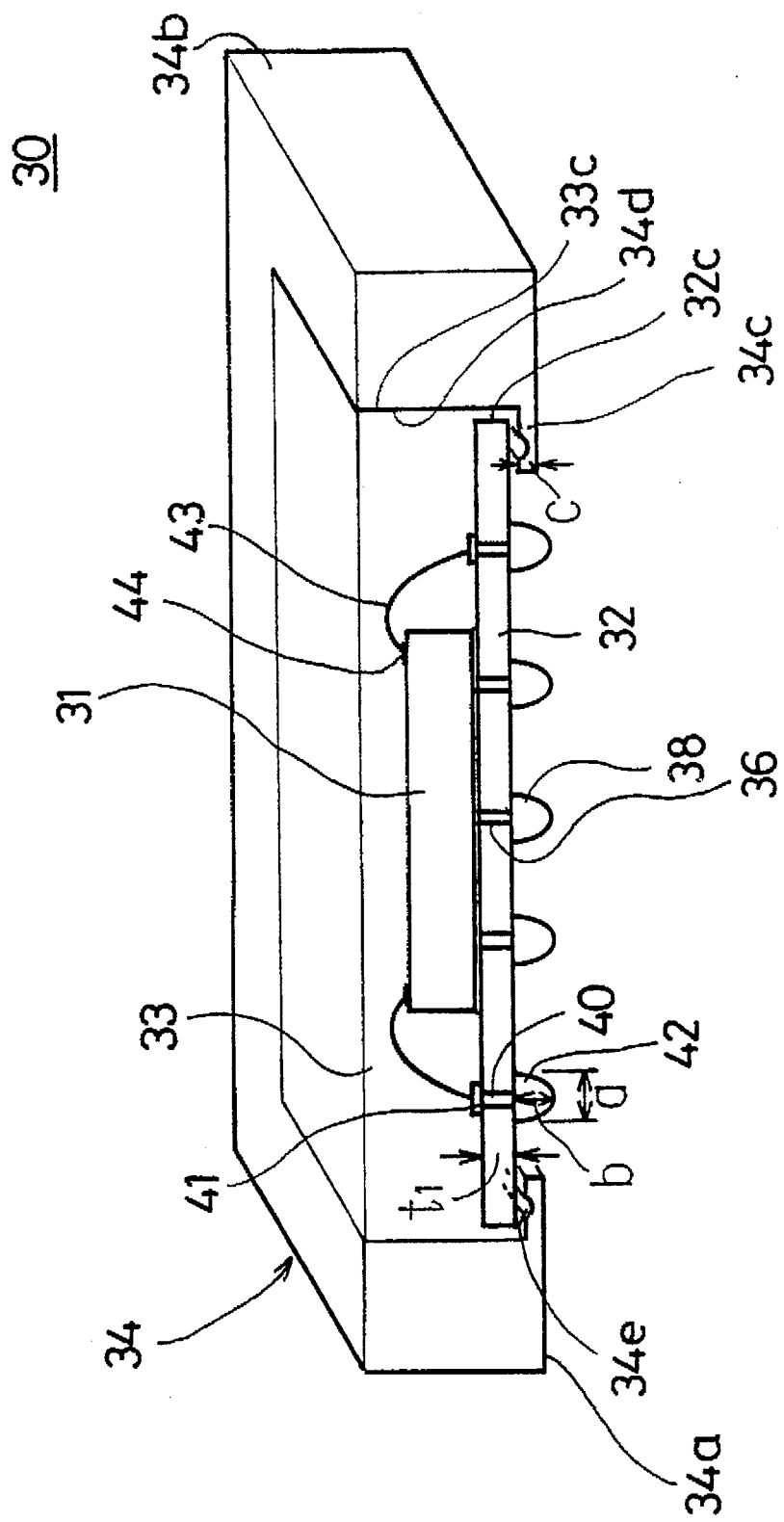
FIG. 3 is a diagram showing the construction of a semiconductor device according to a first embodiment of the present invention in a cross sectional view.
Figure 4:
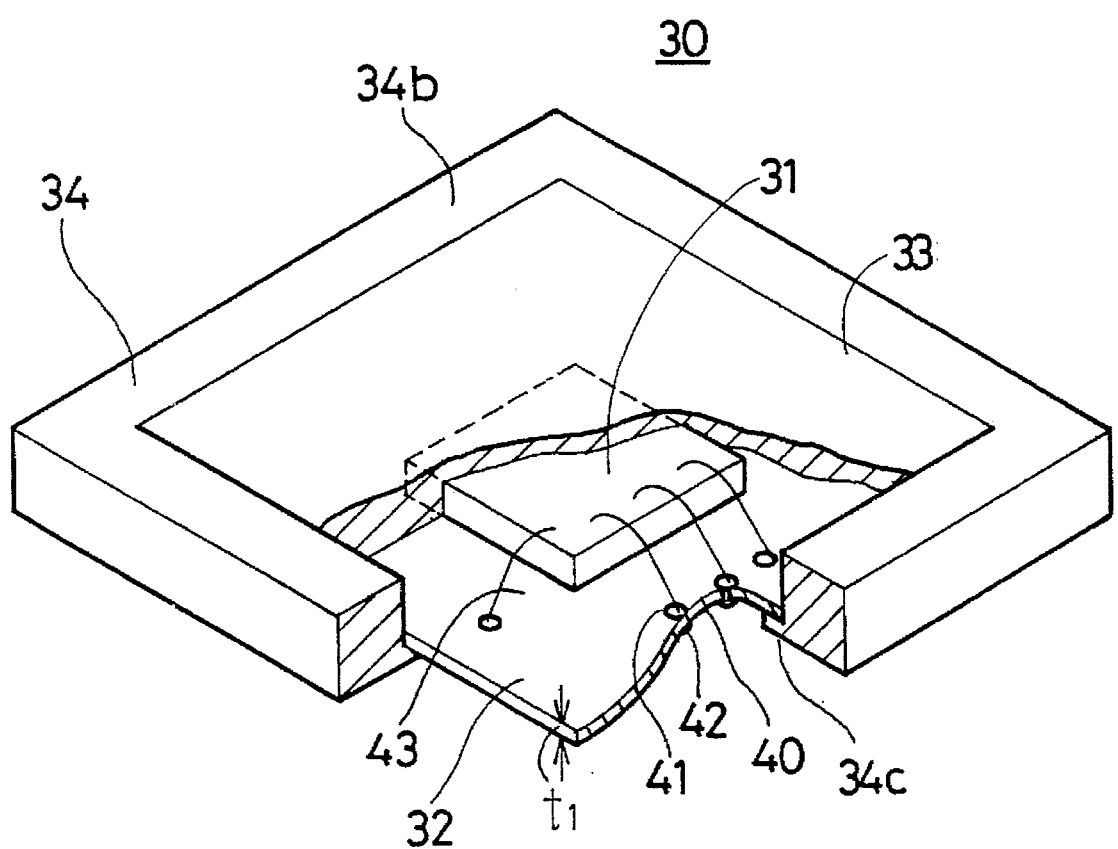
FIG. 4 is a diagram showing the construction of the semiconductor device of FIG. 3 in an oblique view with a part thereof removed.
Figure 5:
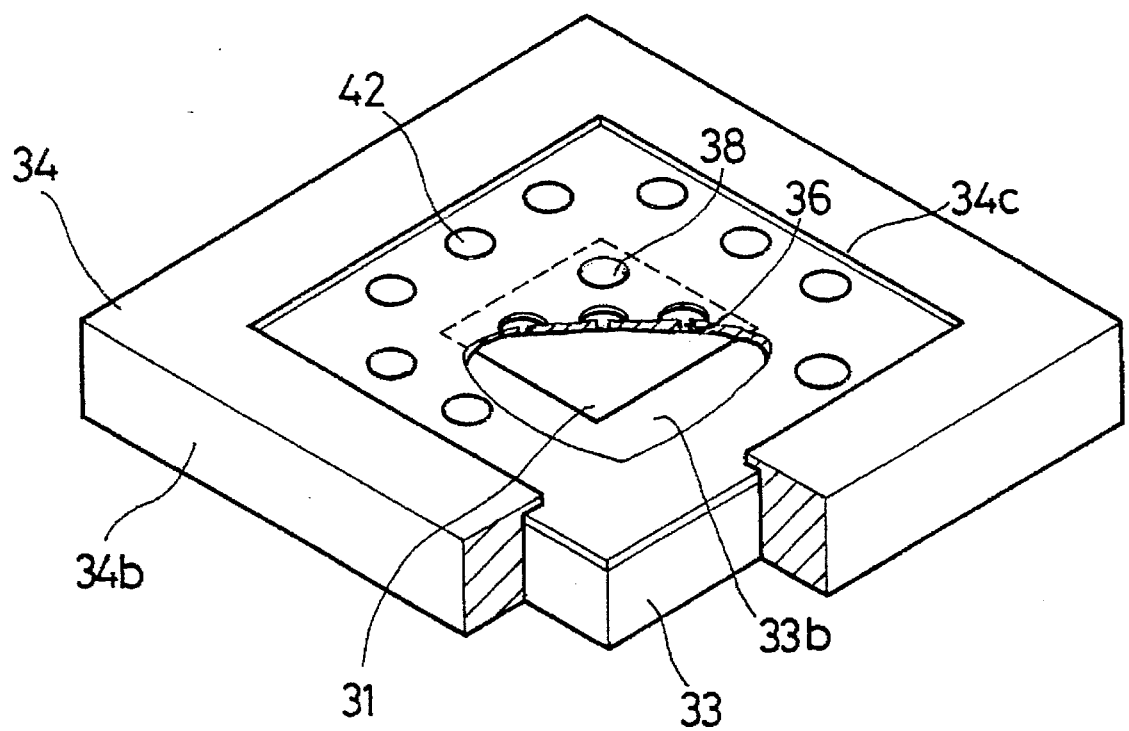
FIG. 5 is a diagram showing the semiconductor device of FIG. 4 in a turned over state.

FIGS. 3–5 show a semiconductor device 30 according to a first embodiment of the present invention.

Referring to FIGS. 3–5, the semiconductor device 30 includes a semiconductor chip 31 held on a substrate 32, wherein it will be noted that the semiconductor chip 31 is encapsulated in a resin package body 33, which in turn is surrounded laterally by a frame member 34. The substrate 32 is defined by a peripheral edge 32c and may have a thickness $t_1$. Typically, the substrate 32 has a square shape and formed of an insulating material such as a ceramic, glass epoxy or glass phenol resin.

Figure 6:
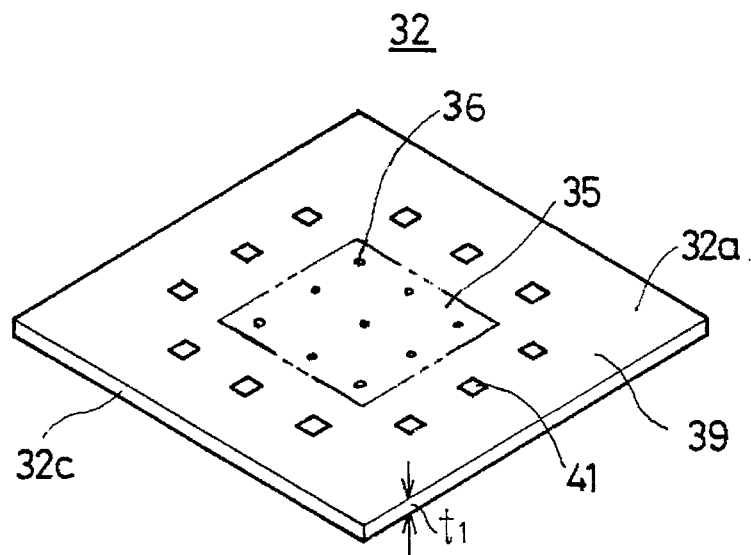
FIG. 6 is a diagram showing a substrate used in the semiconductor device of FIG. 4 in a perspective view.
Figure 7:
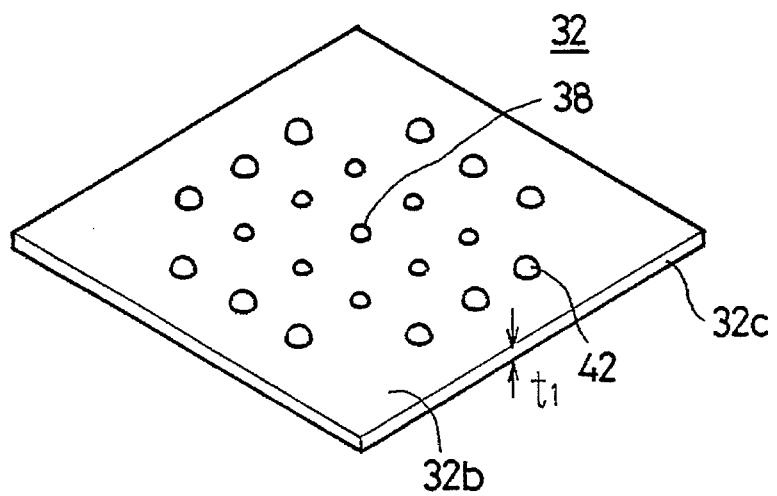
FIG. 7 is a diagram showing the substrate of FIG. 6 in a turned over state.

The substrate 32 has an upper major surface 32a on which a region 35 is defined, as indicated in FIG. 6 by a two-dotted line, for holding the semiconductor chip 31 thereon, wherein the substrate 32 is formed with a number of thermal via holes 36 in correspondence to the region 35, and there are formed a number of solder bumps 38 on a lower major surface 32b of the substrate 32 in correspondence to the thermal via holes 36 as indicated in FIG. 7.

As indicated in FIG. 3, the semiconductor chip 31 is mounted upon the region 35 of the substrate 32 by an epoxy adhesive paste, and there are provided a number of via holes 40 in the substrate 32 in correspondence to the region outside the region 35, wherein contact pads 41 are formed on the upper major surface 32a of the substrate 32 in correspondence to the via holes 40. Similarly, solder bumps 42 are formed on the lower major surface 32b of the substrate 32 in correspondence to the via holes 42. Typically, each of the solder bumps 42 has a diameter a of 0.3–1.0 mm and a height b of 0.2–0.5 mm. Further, bonding wires 43 are provided such that the bonding wires 43 connect bonding pads 44 on the semiconductor chip 31 and the corresponding bonding pads 41 on the substrate 32.

The resin package body 33 is typically formed of an epoxy resin and encapsulates the semiconductor chip 31 in a space defined on the upper major surface 32a of the substrate 32 by the frame member 34 as indicated in FIG. 3. As a result, the resin package body 33 has a side wall 33c surrounding the package body 33 laterally such that the side wall 33c contacts continuously and intimately with a corresponding inner surface 34d of the frame member 34 as well as the bottom surface contacting intimately with the upper major surface 32a of the substrate 32. The frame member 34 may be made of aluminum processed by an anodic oxidation process and carries an aluminum oxide film 34a on the entire surface thereof. Thereby, the frame member 34 is electrically insulated.

It should be noted that the frame member 34 includes a frame body 34b having a generally square shape and has a flange part 34c that protrudes from the inner surface of the frame body 34 in the inward direction. Thereby, the flange part 34c supports the lower major surface 32b of the substrate 32 in correspondence to the peripheral edge 32c thereof. The flange part 34c may have a thickness c of 0.2–0.4 mm which is slightly smaller than the height of the solder bumps 38 or 42. The flange part 34c may be provided with a groove 34e on the upper major surface thereof such that the groove 34e extends along the entire peripheral edge 32c of the substrate 32.

As indicated in FIG. 8, the semiconductor device 30 is mounted upon a multilayered printed circuit board 51 by soldering the solder bumps 42 on corresponding pads on an upper major surface 51a of the printed circuit board 51. Further, the solder bumps 38 are soldered upon a pattern 52 provided on the upper major surface of the printed circuit board 51. Thereby, it should be noted that the frame member 34 establishes an intimate contact engagement with the upper major surface 51a of the printed circuit board 51. The semiconductor device 30 as well as the multilayer printed circuit board 51 form together an electronic apparatus.

Next, the heat dissipation of the semiconductor device 30 will be explained with reference to FIG. 8.

Referring to FIG. 8, the heat generated in the semiconductor chip 31 is conducted through the resin package body 33 and radiated into the environment from an upper major surface 33a of the package body 33. Simultaneously, the heat is conducted from the side wall 33c of the package body 33 to the frame member 34 as indicated in FIG. 8 by an arrow 61. It should be noted that the frame member 34 has a thermal conductivity of $5.7 \times 10^{-2}$ cal/mm·s·°C. when the frame member 34 is formed of aluminum. When the frame member 34 is formed of copper, on the other hand, the frame member 34 shows a thermal conductivity of $9.4 \times 10^{-2}$ cal/mm·s·°C. In any of these cases, the thermal conductivity of the frame member 34 is substantially higher than the thermal conductivity of the resin package body 33 which typically has a thermal conductivity of $2 \times 10^{-4}$ cal/mm·s·°C. Thus, as a result of absorption of heat by the frame member 34 from the resin package body 33 at the side wall 33c and the emission to the environment from the frame member 34 indicated by an arrow 62a in FIG. 8, as well as a result of emission from the upper major surface of the resin package body 33 as indicated by an arrow 60, the radiation of heat from the semiconductor device 31 as a whole increases substantially. It should further be noted that the heat is emitted also from the upper surface of the frame member 34 to the environment as indicated by another arrow 62b in FIG. 8. As a result of the efficient heat radiation, the resin package body 33 shows a temperature $T_2$ that is substantially lower than a temperature $T_1$ for the case corresponding to the device of FIG. 1 in which no such a frame is provided.

In addition to the foregoing radiation of heat, the heat in the semiconductor chip 31 is conducted to the printed circuit board 51 via the thermal via holes 36 as well as via the solder bumps 38 filling the holes 36 as indicated in FIG. 8 by an arrow 63. In addition, conduction of heat occurs also from the frame member 34 to the printed circuit board 51 as indicated by an arrow 64.

Figure 1:
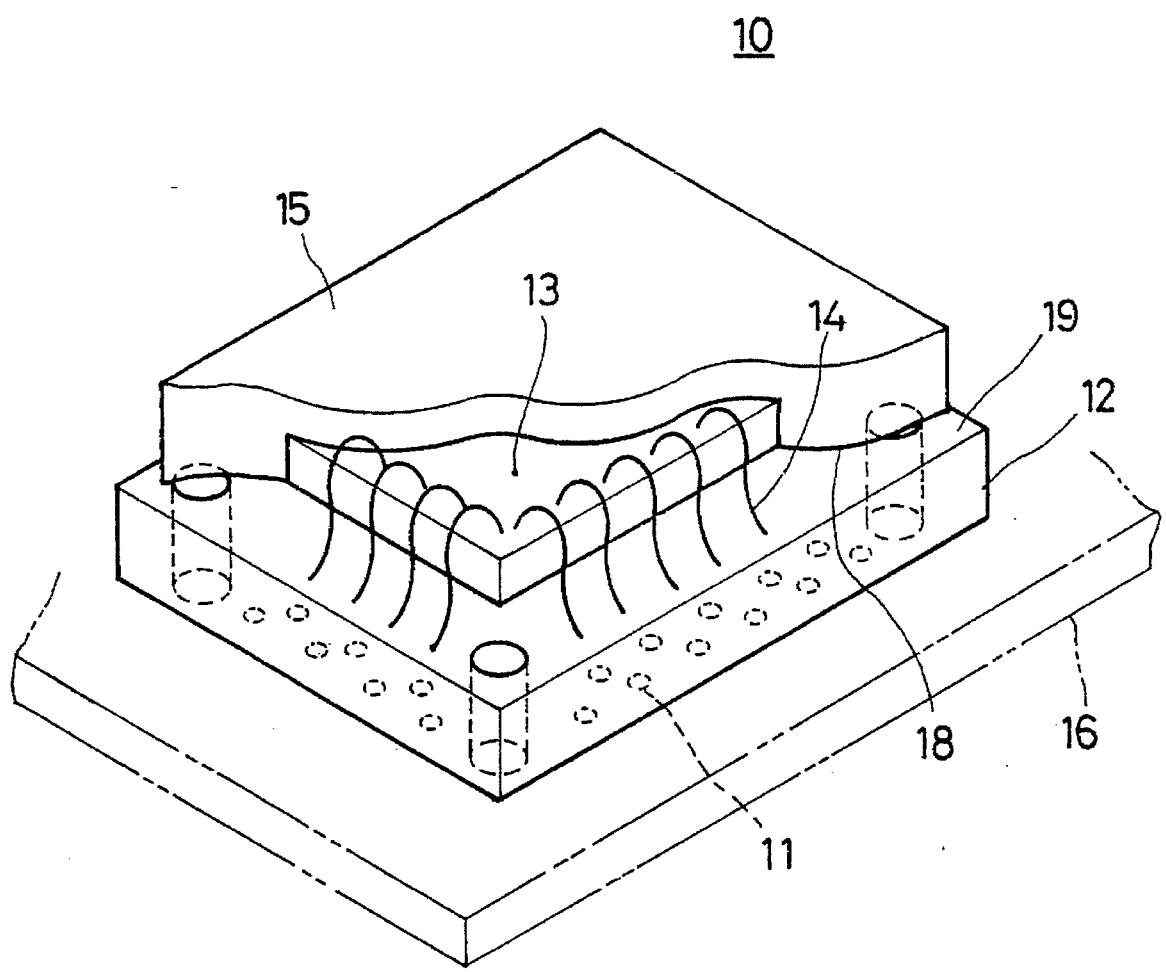
FIG. 1 is a diagram showing the construction of a conventional semiconductor device.
Figure 2:
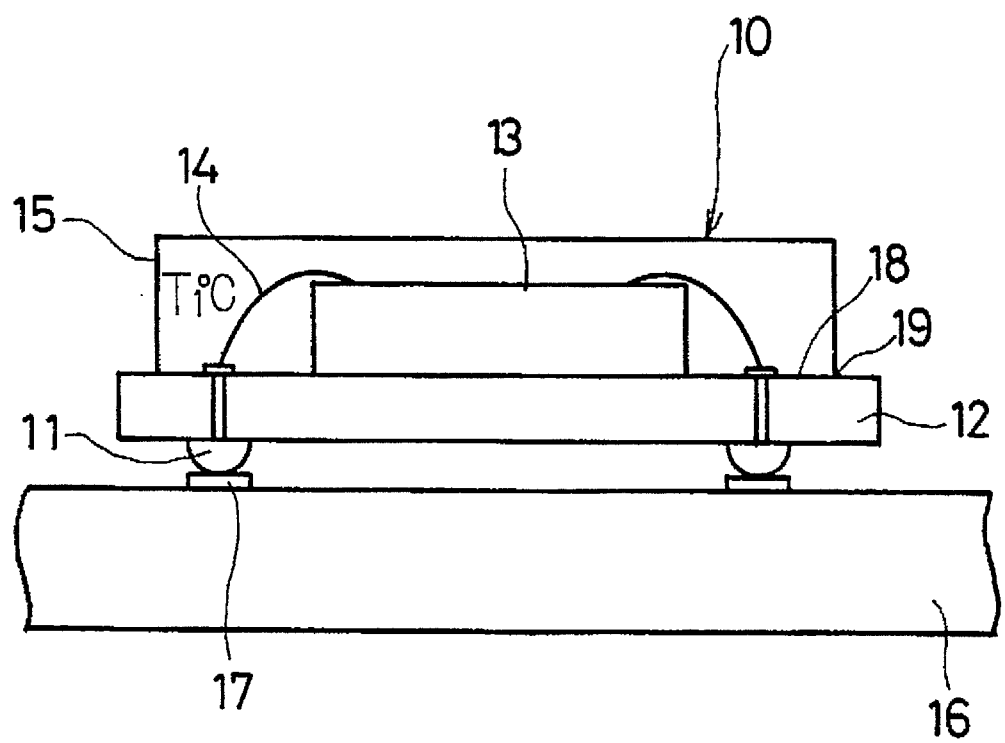
FIG. 2 is a diagram showing the state in which the semiconductor device of FIG. 1 is mounted upon a substrate.
Figure 9A:
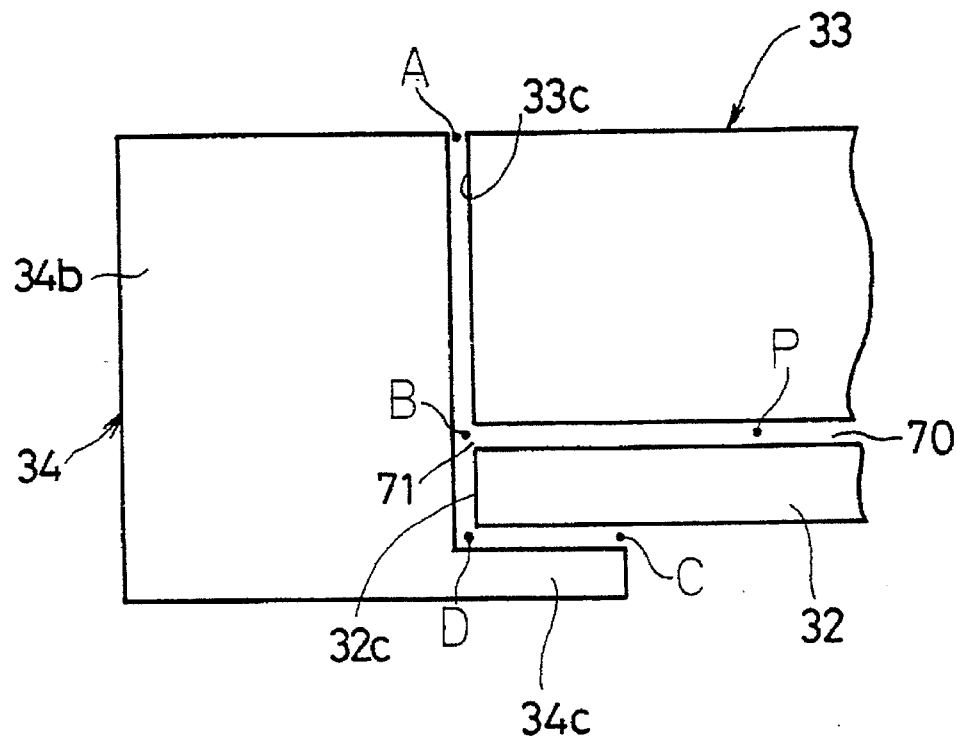
FIGS. 9A and 9B are diagrams showing the penetration of moisture into the semiconductor device in comparison with a conventional semiconductor device structure.
Figure 9B:
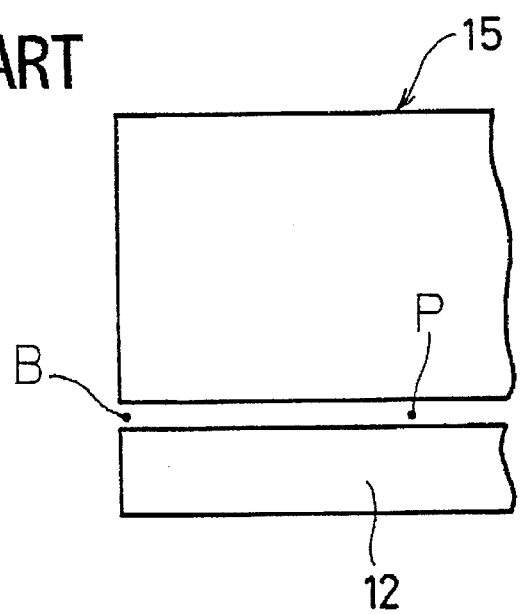

Next, the moisture resistance of the semiconductor device will be described with reference to FIGS. 9A and 9B wherein FIG. 9A shows a part of the semiconductor device 30 in an enlarged scale while FIG. 9B shows a part of the conventional semiconductor device 10 of FIG. 1 in an enlarged scale.

In the conventional device of FIG. 9B, it should be noted that the moisture enters into the semiconductor device along the boundary between the resin package body 15 and the substrate 12 at an outer edge B, and the moisture thus entered reaches a point P located inside the device. In other words, the moisture penetrates along a path B→P, which is relatively small. In the device of the present invention shown in FIG. 9A, it should be noted that the resin package body 33 and the substrate 32 are contacting with each other at an interface 70, wherein the outer edge of the interface 70 is covered by the frame body 34b of the frame member 34. In this case, the moisture enters either at a point A located at the top surface of the device or a point C at the inner edge of the flange part 34c, wherein the moisture that has entered at the point A reaches the point P corresponding to the point P of FIG. 9B via a path of A →B→P, while the moisture that has entered at the point C reaches the point P via a path of C→B→P. Any of the paths A→B→P and C→B→P is substantially longer than the path B→P shown in FIG. 9B. Thus, the chance that the moisture reaches the point P inside the device is substantially smaller in the device of the present invention as compared with the conventional device of FIG. 9B.

Next, the fabrication process of the semiconductor device 30 will be described with reference to FIG. 10.

Figure 10:
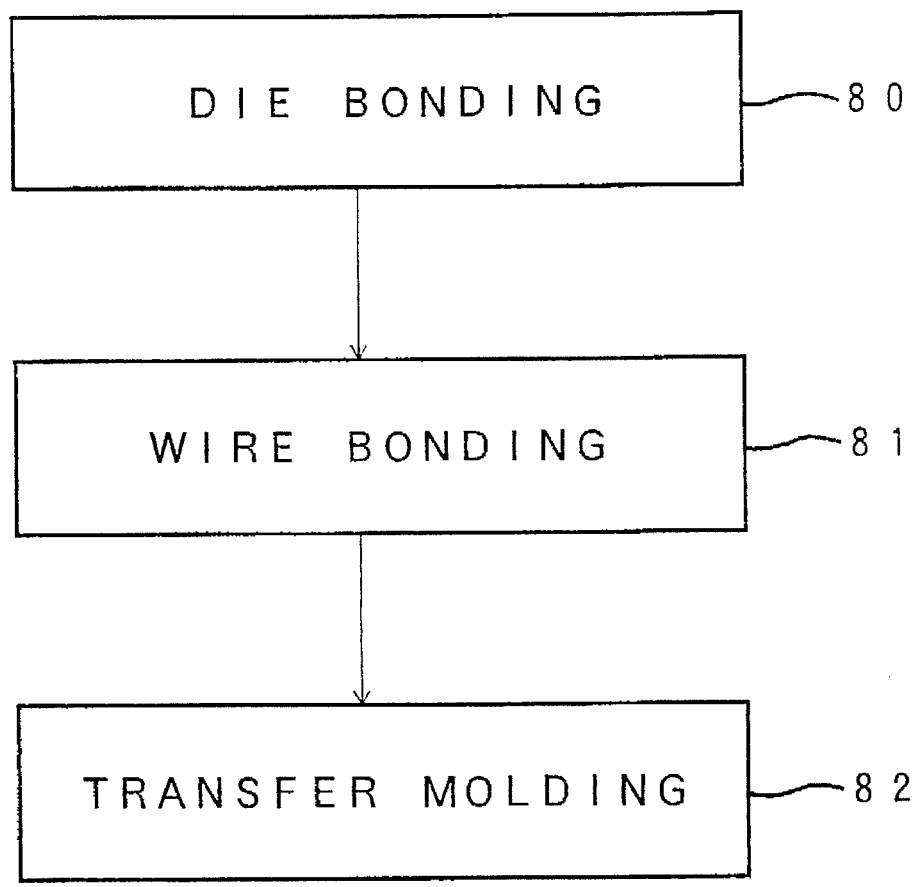
FIG. 10 is a diagram showing the process for fabricating the semiconductor device of the first embodiment.
Figure 11:
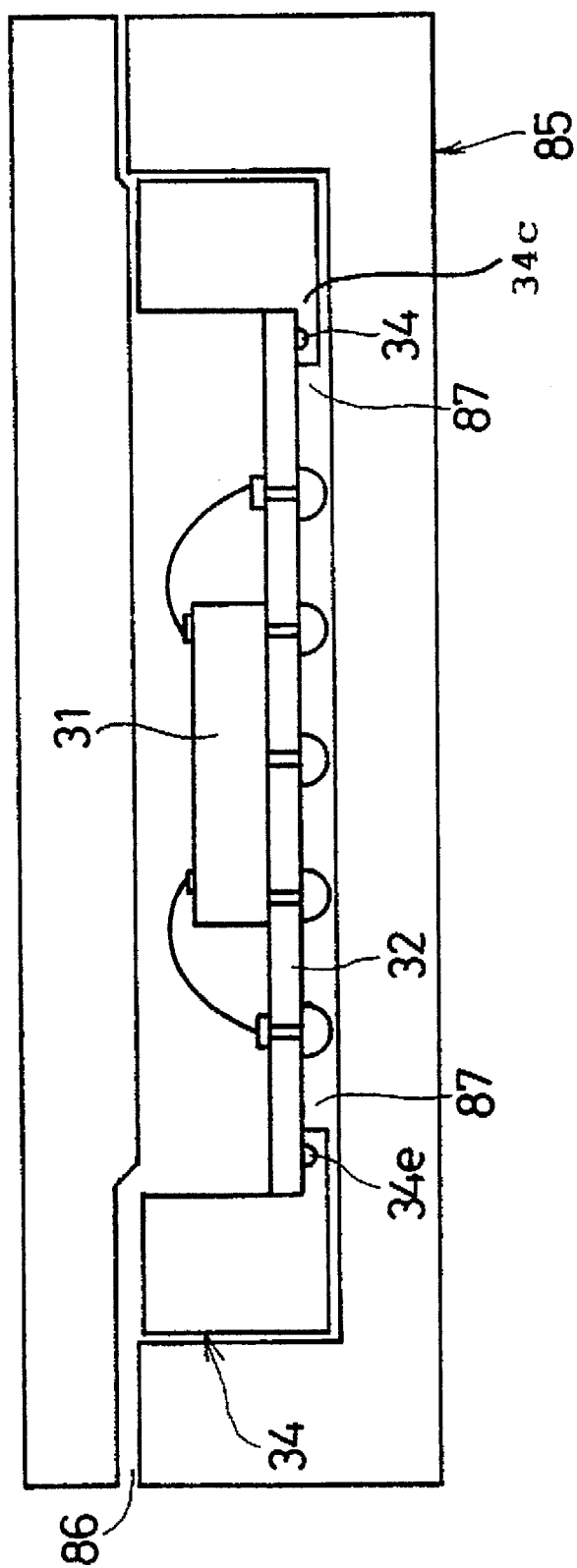
FIG. 11 is a diagram showing the step of transfer molding included in the fabrication process of FIG. 10.
Figure 12:
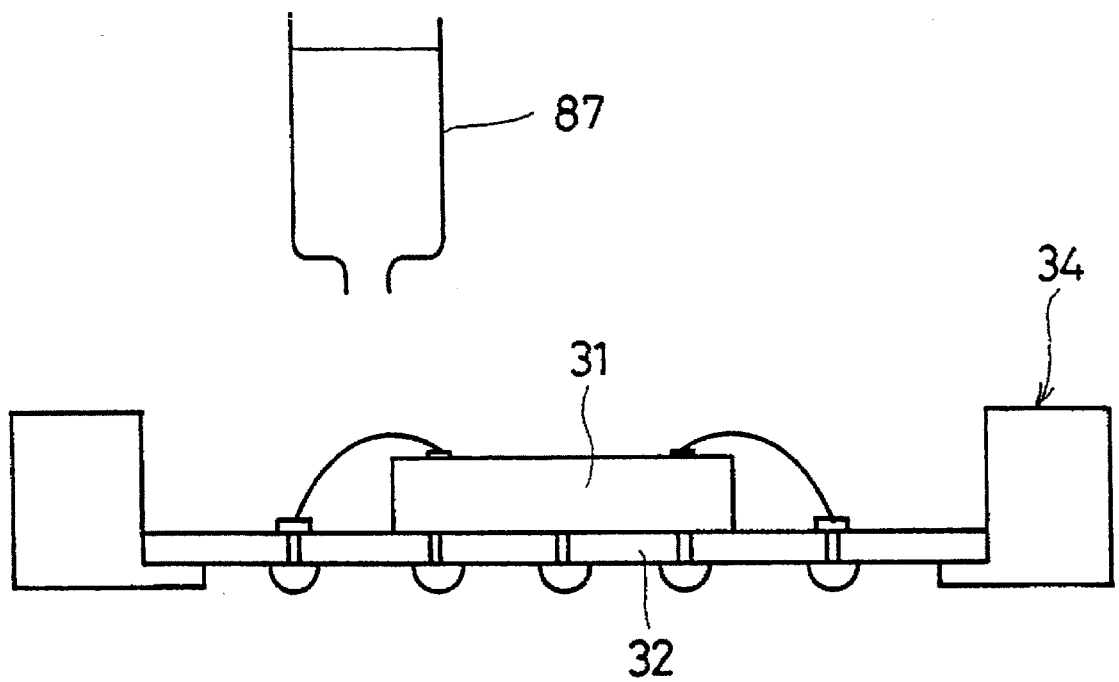
FIG. 12 is a diagram showing the step of potting employed for fabricating the semiconductor device of the first embodiment.

Referring to FIG. 10, a step 80 is conducted first for mounting the semiconductor chip 31 on the region 35 of the substrate 32 by way of a die bonding process. Next, in a step 81, a wire bonding process is conducted for achieving interconnection between the semiconductor chip 31 and the substrate 32 by the bonding wire 43. Further, a step 82 is conducted in which the substrate 32 carrying thereon the semiconductor device 32 and having interconnection achieved by the bonding wire 42, is mounted upon the frame member 34 such that the substrate 32 is supported by the flange part 34c of the frame member 34 as already explained. Further, the frame member 34 thus carrying the substrate 32 is mounted upon a die 85 as indicated in FIG. 11, and a transfer molding process is conducted by pouring a resin into the mold via an inlet 86. By curing the resin thus molded, the semiconductor device 30 described heretofore is fabricated.

When applying the transfer molding process, it should be noted that the groove 34e on the flange part 34c acts so to prevent the flow of the resin penetrating into the space 87 below the substrate 82.

It should also be noted that one may employ a potting process in place of the transfer molding process to fabricate the semiconductor device 30. When conducting a potting, a resin held in a vessel 87 is poured onto the substrate 32 including the semiconductor chip 31 such that the resin fills the space formed by the frame member 34.

As already noted, the frame member 34 may be formed of aluminum or copper covered by an aluminum oxide film or copper oxide film formed by an anodic oxidation process. Alternatively, one may employ an aluminum alloy for the frame member 34. In this case, too, the surface of the frame member 34 is covered by an aluminum oxide film formed by the anodic oxidation process.

Next, a semiconductor device 90 according to a second embodiment of the present invention will be described with reference to FIG. 13, wherein the semiconductor device 90 differs from the semiconductor device 30 only in the point that a frame member 34A is used in place of the frame member 34. Thus, those parts of FIG. 13 corresponding to the parts described heretofore are designated by the same reference numerals and the description thereof will be omitted.

Figure 13:
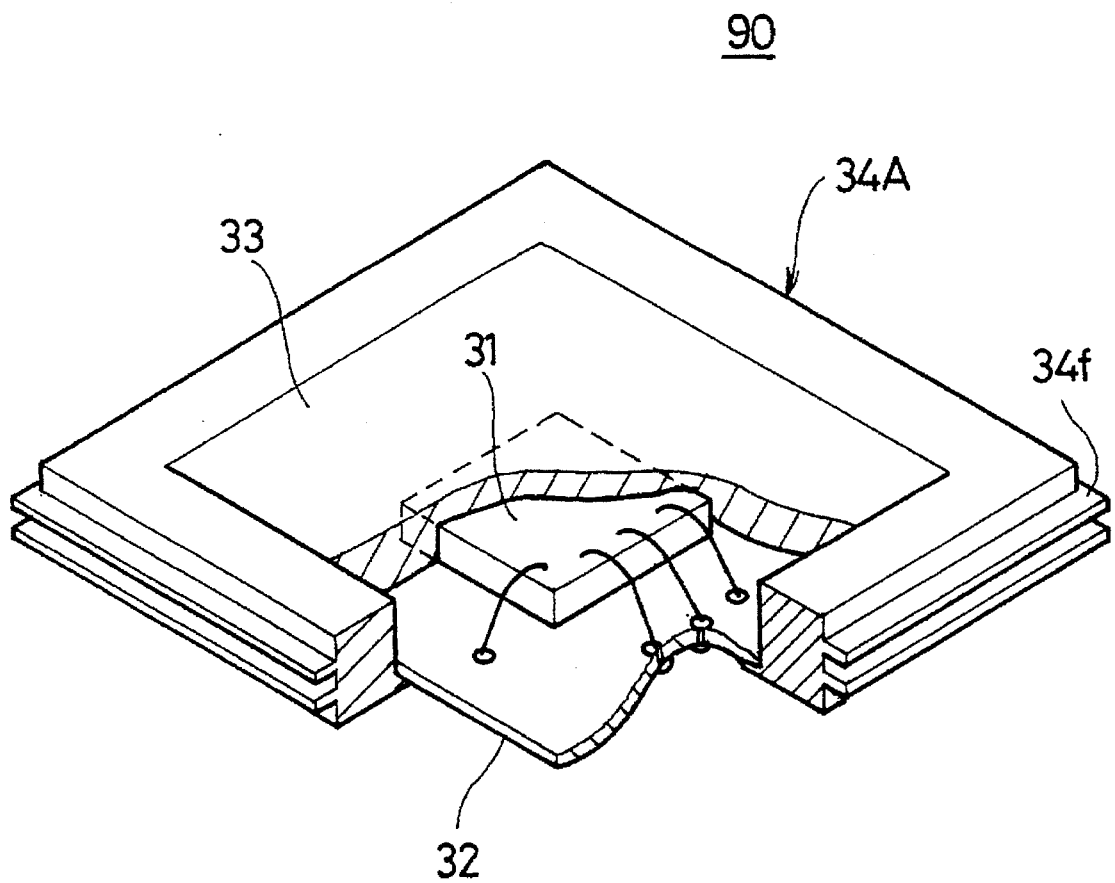
FIG. 13 is a diagram showing the construction of a semiconductor device according to a second embodiment of the present invention.

Referring to FIG. 13, the frame member 34A carries heat radiation fins 34f on the outer peripheral surface thereof. By providing such radiation fins 34f, the radiation of heat from the frame member 34 to the environment indicated in FIG. 8 by the arrow 62a increases substantially. Associated with the increased heat radiation at the frame member 34, the heat transfer from the resin package body 33 to the frame member 34A by way of the heat conduction indicated in FIG. 8 by the arrow 61 increases substantially. It should be noted that such an efficient removal of heat from the package body 33 to the frame member 34A substantially facilitates the removal of heat from the semiconductor chip 31 to the resin package body 33.

Figure 14:
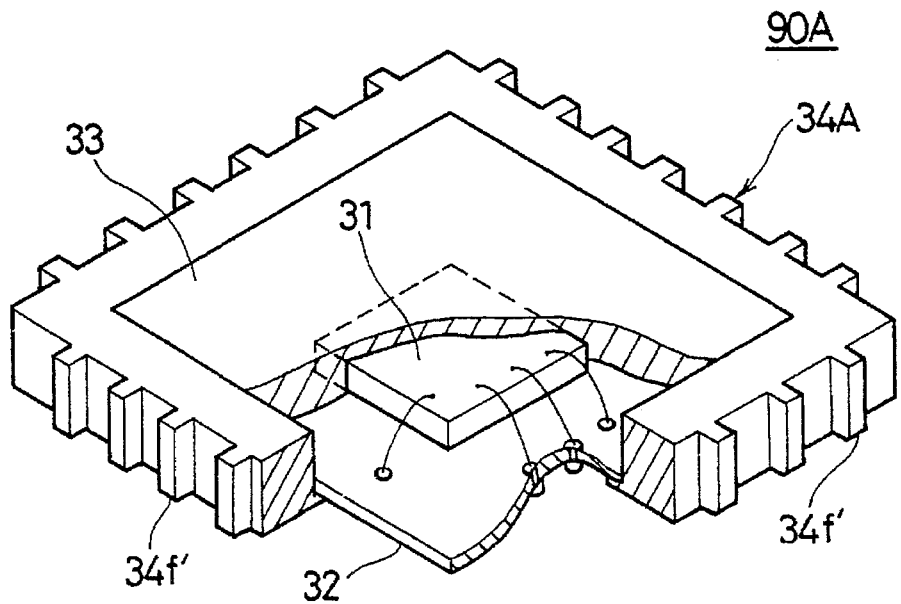
FIG. 14 is a diagram showing a modification of the semiconductor device of FIG. 13.

FIG. 14 shows a semiconductor device 90A according to a modification of the device 90. In the device 90A, it will be noted that the frame member 34A has heat radiation fins 34f' extending vertically. Other aspects of the device 90A are substantially identical with the device 90 of FIG. 13, and further description will be omitted.

Figure 15:
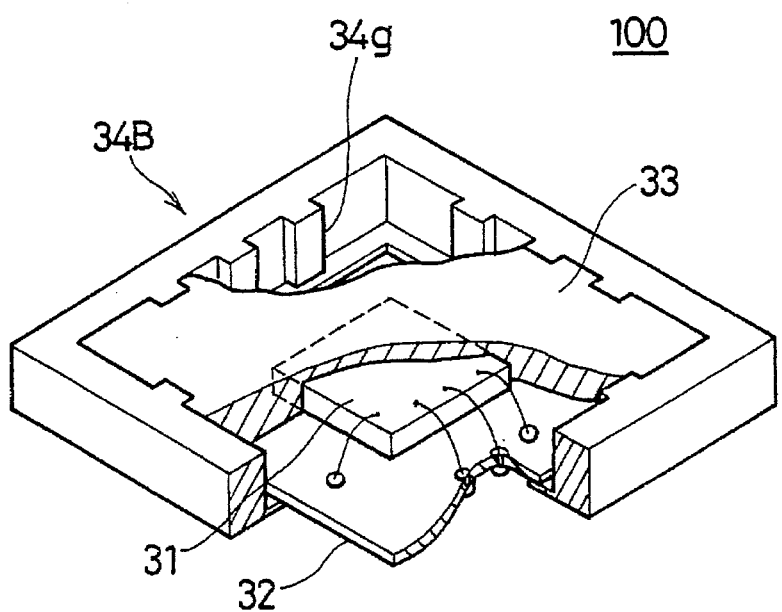
FIG. 15 is a diagram showing the construction of a semiconductor device according to a third embodiment of the present invention.

FIG. 15 shows a semiconductor device 100 according to a third embodiment of the present invention, wherein the semiconductor device 100 differs from the device 30 of FIG. 4 only in the point that the device 100 uses a frame member 34B in place of the frame member 34. As other aspects of the present embodiment are substantially identical with the device 30 of FIG. 4, those portions corresponding to the portions described previously are designated by the corresponding reference numerals and the description thereof will be omitted.

Referring to FIG. 15, the frame member 34B includes ribs 34g at the inner periphery of the frame body 34b such that the ribs 34g extend vertically. According to the construction of FIG. 15, it should be noted that the area of contact between the outer periphery 33a of the resin package body 33 and the inner periphery of frame member 34 increases and the heat transfer from the resin package body 33 to the frame member 34B increases substantially. Further, the ribs 34g act as an anchor for fixing the frame member 34B upon the resin package body 33, and a stable adherence is guaranteed between the package body 33 and the frame member 34B.

Next, a semiconductor device 110 according to a fourth embodiment of the present invention will be described with reference to FIGS. 16 and 17, wherein the semiconductor device 110 differs from the semiconductor device 30 of FIG. 4 only in the point that a frame member 34C is used in place of the frame member 34. Thus, those parts described previously are designated by the same reference numerals and the description thereof will be omitted.

Figure 16:
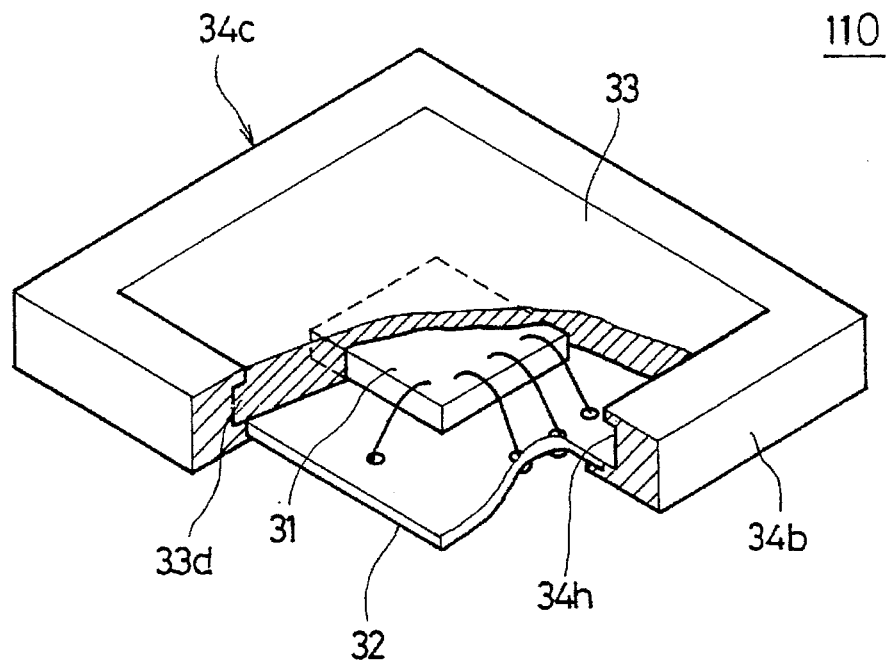
FIG. 16 is a diagram showing the construction of a semiconductor device according to a fourth embodiment of the present invention.
Figure 17:
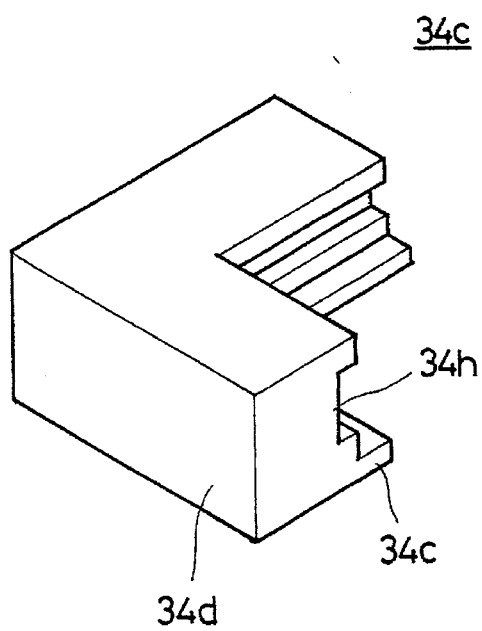
FIG. 17 is a diagram showing a part of the frame member used in the semiconductor device of FIG. 16.

Referring to FIGS. 16 and 17, the frame member 34C includes a groove 34h on the inner periphery of the frame body 34b. Thus, the peripheral part of the resin package body 33 penetrates into the groove 34h of the frame member 34c and a reliable engagement is achieved between the resin package body 33 and the frame member 34c in addition to the increased heat transfer from the resin package body 33 to the frame member 34C.

Figure 18:
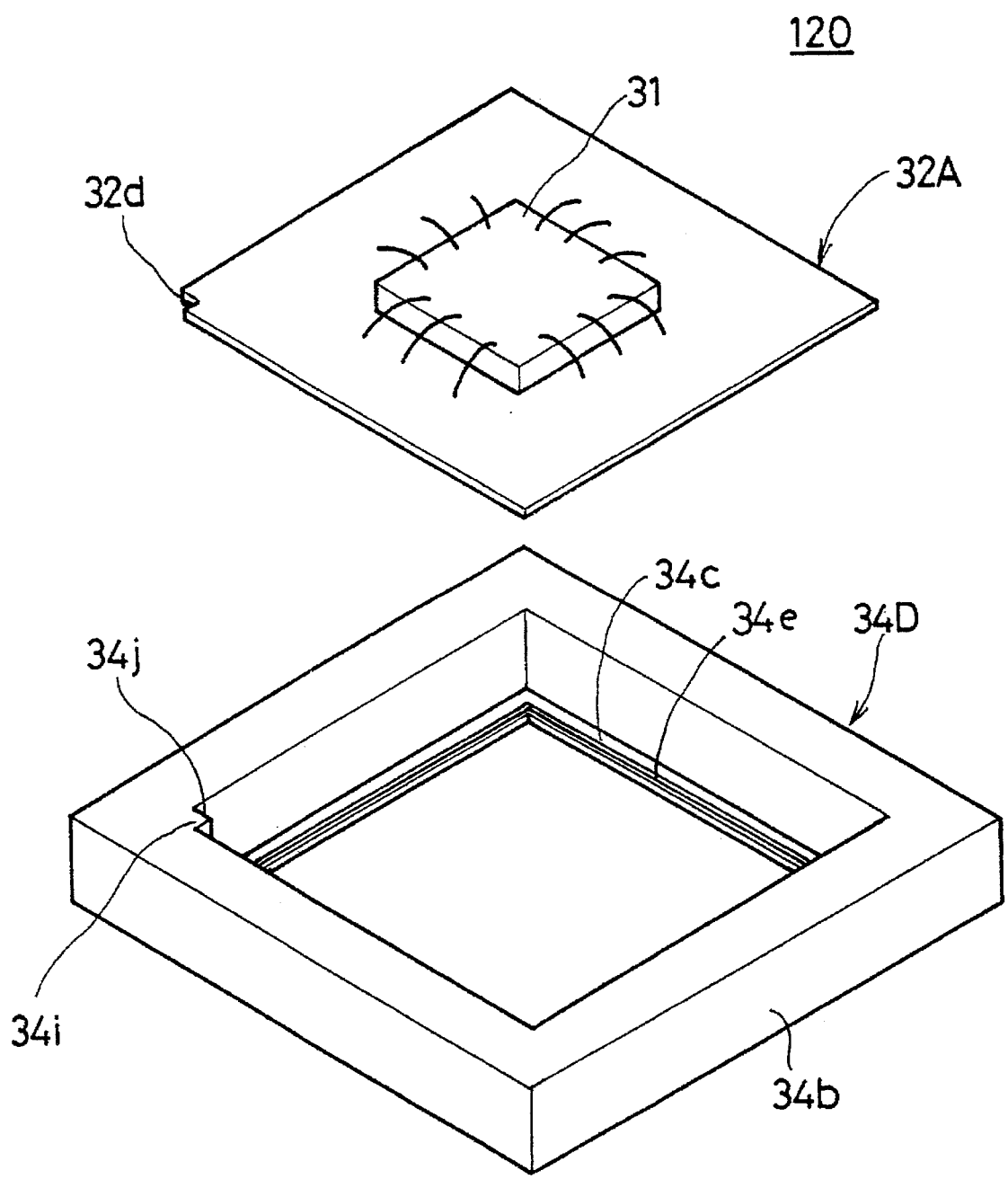
FIG. 18 is a diagram showing the construction of a semiconductor device according to a fifth embodiment of the present invention in an exploded view.

Next, a semiconductor device 120 according to a fifth embodiment of the present invention will be described with reference to FIG. 18, wherein FIG. 18 shows the semiconductor device 120 in an exploded view. For the sake of simplicity, the resin package body is omitted from illustration in FIG. 18.

Referring to FIG. 18, it will be noted that the semiconductor device 120 uses a frame member 34D that includes a projection 34j in correspondence to a corner 34i at the inner periphery of the frame member 34D, and a substrate 32A is mounted upon the frame member 34D in place of the substrate 32. The substrate 32A differs from the substrate 32 in the point that the substrate 32A includes a cutout 32d at a corner thereof in correspondence to the projection 34j on the inner periphery of the frame member 34D. Thus, the substrate 32A is mounted upon the frame member 34D in the state that the cutout 32d mates with the corresponding projection 32d. In other words, the substrate 32A is mounted with a predetermined orientation with respect to the frame member 32A.

Figure 19:
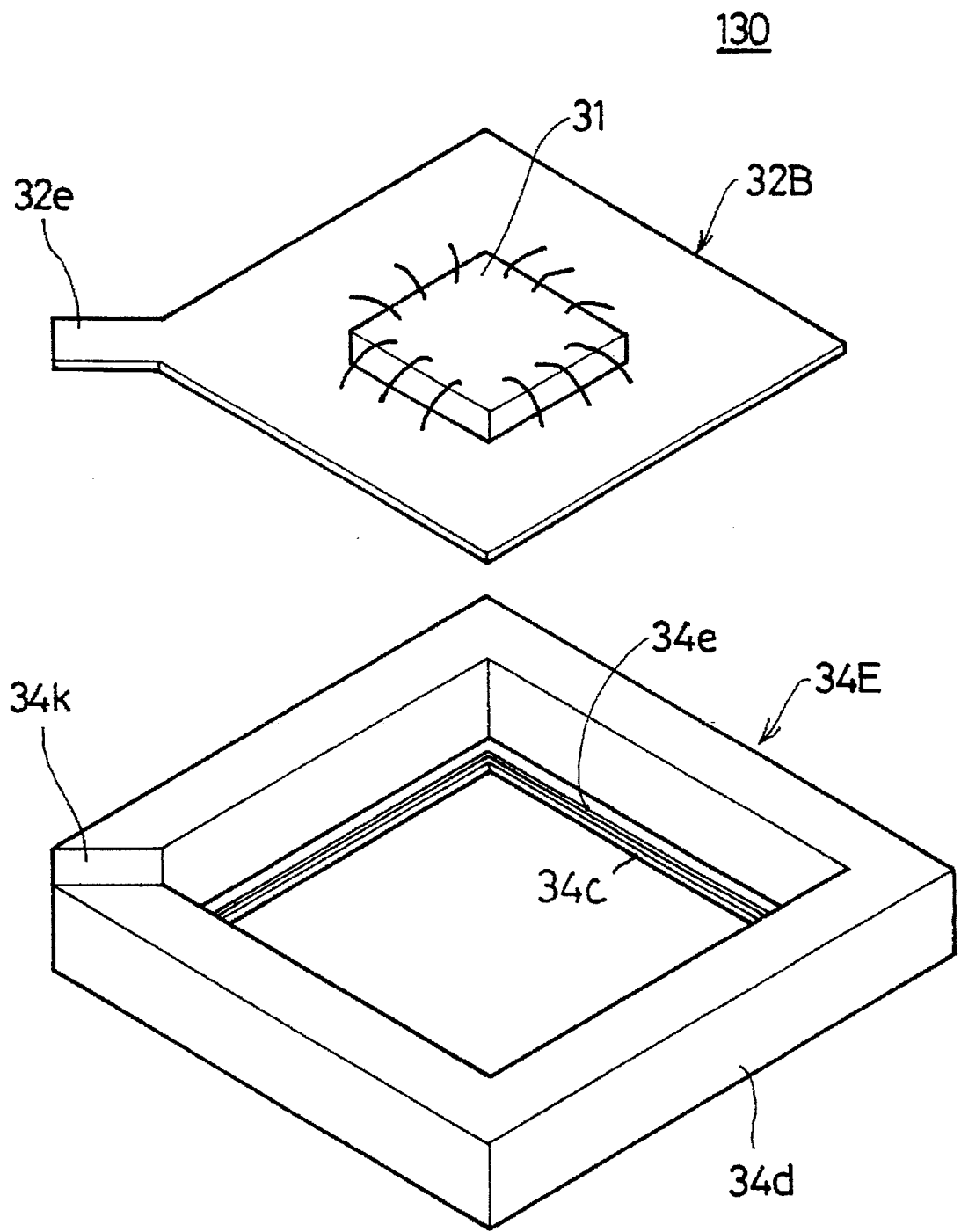
FIG. 19 is a diagram showing the construction of a semiconductor device according to a sixth embodiment of the present invention in an exploded view.

Next, a semiconductor device 130 according to a sixth embodiment of the present invention will be described with reference to FIG. 19 that shows the semiconductor device 130 in an exploded state. In FIG. 19, too, the illustration of the resin package body is omitted for the sake of simplicity.

Figure 20:
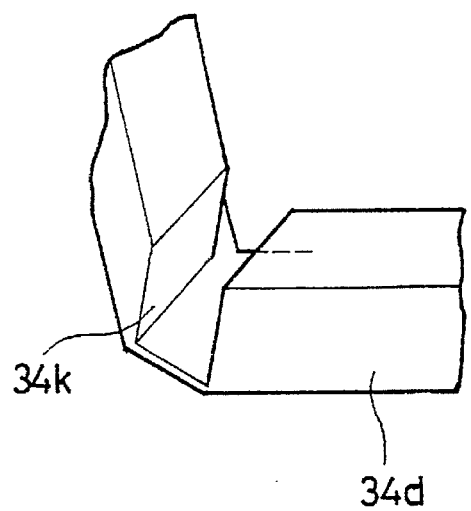
FIG. 20 is a diagram showing a part of the frame member used in the semiconductor device of FIG. 19 in an enlarged scale.

Referring to FIG. 19, the semiconductor device 130 uses a substrate 32B in place of the substrate 32 in combination with a frame member 34E that replaces the frame member 34, wherein the substrate 32B includes an arm portion 32e at a corner thereof such that the arm portion 32e extends in an outward direction. In correspondence to the arm portion 32e, the frame member 34E includes a groove 34k at a corner thereof as indicated in detail in FIG. 20, such that the arm portion 32e is accepted in the groove 34k when the substrate 32B is mounted upon the frame member 34E.

The semiconductor device 130 thus provides the preferable feature similar to the semiconductor device 120 in that the orientation of the frame 34E with respect to the substrate 32B is determined uniquely. In addition, the semiconductor device 130 having the structure of FIG. 19 is advantageous in view of the mass production of the device as will be described below with reference to FIGS. 21 and 22.

Figure 21:
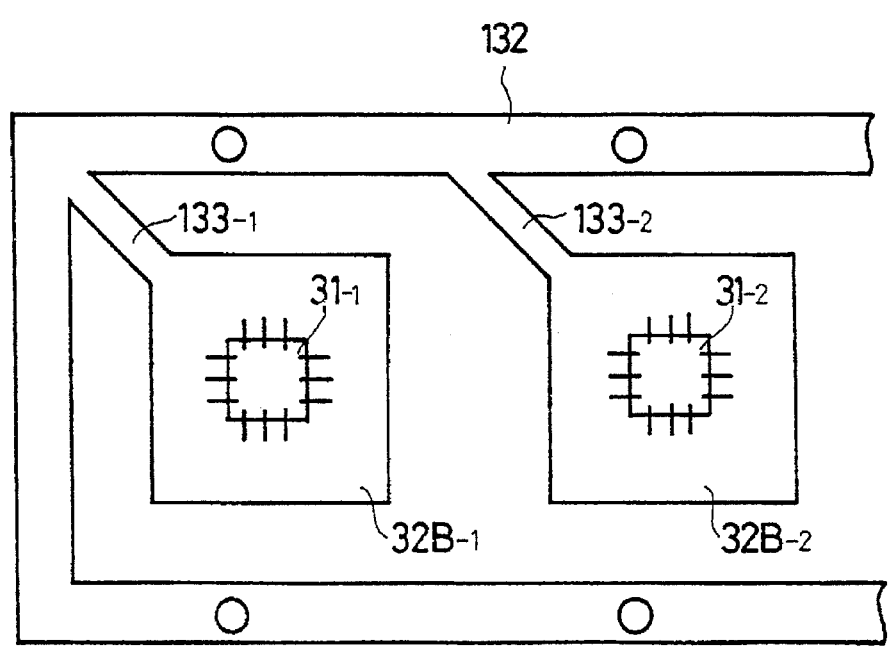
FIG. 21 is a diagram showing a frame used in the fabrication of a semiconductor device of FIG. 19.
Figure 22:
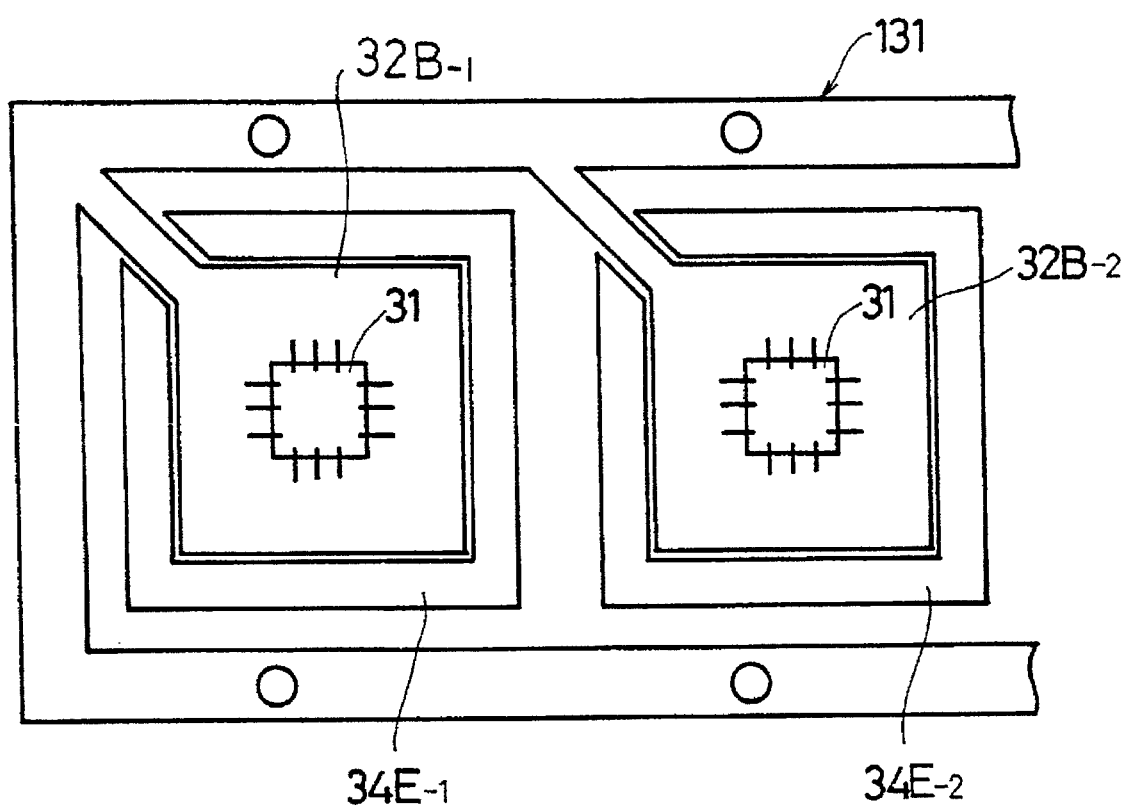
FIG. 22 is a diagram showing an intermediate step for fabricating the semiconductor device of FIG. 19.

Referring to FIG. 21 showing a substrate frame 131, the substrate frame 131 includes a frame main body 132 in which a number of substrate elements $32B_{-1}$, $32B_{-2}$, ... are connected by respective arm portions $133_{-1}$, $133_{-2}$, ... to form a unitary body. Each of the substrate elements $32B_{-1}$, $32B_{-2}$, ... carry respective semiconductor devices $31_{-1}$, $31_{-2}$, ... thereon, while there is provided a mold (not shown) in correspondence to each of the substrate elements $32B_{-1}$, $32B_{-2}$, ... wherein the mold accommodates therein a frame member such as a frame member $34E_{-1}$, $34E_{-2}$, ... Thus, the substrate elements $32B_{-1}$, $32B_{-2}$, ... are accommodated in corresponding frame members $34E_{-1}$, $34E_{-2}$, ... in the molding process, and the transfer molding process is applied simultaneously to each of the substrate elements $34E_{-1}$, $34E_{-2}$, ... to form respective semiconductor devices 130 in the state that the semiconductor devices 130 are connected to the frame main body 131 by the respective arm portions $133_{-1}$, $133_{-2}$, ... Further, by cutting the arm portions, the semiconductor devices are separated into individual semiconductor devices 130.

Further, the present invention is not limited to the embodiments described heretofore, but various variations and modifications may be made without departing from the scope of the invention.

What is claimed is:

1. A semiconductor device, comprising:
   a substrate having upper and lower major surfaces;
   solder bumps provided on said lower major surface of said substrate;
   a semiconductor chip provided on said upper major surface of said substrate;
   a resin package body provided on said upper major surface of said substrate so as to bury said semiconductor chip therein, said resin package body having an upper major surface and side walls surrounding said package body;
   a thermally conductive frame member having a thermal conductivity substantially greater than that of said resin package body and extending along to and in an intimate contact with said side walls of said resin package body thereby leaving the upper major surface of said resin package body exposed to the air; said thermally conductive frame having a flange part supporting said substrate thereon at a rim part of said substrate.

2. A semiconductor device as claimed in claim 1, wherein said thermally conductive frame member carries a heat radiating fin structure on an outer, exposed surface thereof.

3. A semiconductor device as claimed in claim 1, wherein said thermally conductive frame member carries one or more projecting ribs on an inner surface thereof that intimately contacts with said side walls of said resin package body, such that said one or more ribs project into said resin package body.

4. A semiconductor device as claimed in claim 1, wherein said thermally conductive frame member carries one or more grooves extending along an inner periphery thereof.

5. A semiconductor device as claimed in claim 1, wherein said thermally conductive frame member carries a projection on an inner surface thereof facing said side walls of said resin package body in correspondence to a corner of said frame member, such that said projection engages with a mating depression on a corresponding corner of said resin package body.

6. A semiconductor device as claimed in claim 1, wherein said thermally conductive frame member comprises a material selected from a group consisting of aluminum, an aluminum alloy, copper and a copper alloy, and carries an oxide film thereon.

7. An electronic apparatus, comprising:
- a substrate having upper and lower major surfaces and surrounded by a peripheral edge, said substrate carrying a plurality of conductive bumps on said lower major surface of said substrate;
- a semiconductor chip provided on said upper major surface of said substrate in electrical connection with solder bumps;
- a resin package body provided on said upper major surface of said substrate such that said resin package body encapsulates said semiconductor chip therein, said resin package body having a peripheral wall surrounding said resin package body; and
- a frame member having a thermal conductivity larger than a thermal conductivity of said resin package body, said frame member being provided on said resin package body to surround said peripheral edge in a continuous and intimate contact with said peripheral wall of said package body; and
- a printed circuit board having an upper major surface and carrying an interconnection conductor pattern on said upper major surface, said substrate being provided on said upper major surface of said printed circuit board such that said plurality of conductive bumps establish electrical connections with corresponding conductor patterns on said upper major surface of said printed circuit board and such that said frame member establishes an intimate mechanical contact with said upper major surface of said substrate.

8. A semiconductor device as claimed in claim 7, wherein said frame member carries an insulating coating for electrically insulating the frame member.

* * * * *